United States Patent
Kleine et al.

[11] Patent Number: 6,128,356
[45] Date of Patent: Oct. 3, 2000

[54] CMOS CIRCUIT COMPOSED OF CMOS CIRCUIT BLOCKS ARRANGED IN BIT-PARALLEL DATA PATHS

[75] Inventors: Ulrich Kleine, Helmstedt; Mike Vogel, Regensburg, both of Germany

[73] Assignee: Siemens Aktiengesellschaft, Munich, Germany

[21] Appl. No.: 08/890,306

[22] Filed: Jul. 9, 1997

[30] Foreign Application Priority Data

Jul. 9, 1996 [DE] Germany .................. 196 27 634

[51] Int. Cl.⁷ ............................................. H04L 7/00
[52] U.S. Cl. ................................. 375/354; 375/359
[58] Field of Search ................... 375/354, 359, 375/364, 358, 371; 327/141, 144, 152, 153, 161, 210, 211, 212; 371/22.36, 27.7

[56] References Cited

U.S. PATENT DOCUMENTS

| | | | |
|---|---|---|---|
| 5,032,783 | 7/1991 | Hwang et al. | 324/73.1 |
| 5,121,010 | 6/1992 | Hoshizaki et al. | 307/528 |
| 5,179,294 | 1/1993 | Bechade et al. | 307/265 |
| 5,710,911 | 1/1998 | Walsh et al. | 395/555 |
| 5,714,904 | 2/1998 | Jeong | 327/407 |
| 5,751,665 | 5/1998 | Tanoi | 327/147 |

OTHER PUBLICATIONS

E J Mc Cluskey, Logic Design Principles With Emphasis on Testable Semicustom Circuits, (Chapter 3, Analysis of Combinational Circuits), Prentice Hall, (1986), pp. 84–93.

T K Liu, Synthesis Algorithm for 2–Levels MOS Networks, IEEE Trans. on Computers, Band–C–24, No. 1, Jan. 1975, pp. 72–79.

P E Landman et al, Power Estimation for High Level Synthesis, IEEE (1993), pp. 361–366.

W Ulbrich et al, Design of Dedicated MOS Digital Filters For High–Speed Applications, Proceedings of ISCAS (1985), pp. 255–258.

*Primary Examiner*—Chi H. Pham
*Assistant Examiner*—Emmanuel Bayard
*Attorney, Agent, or Firm*—Hill & Simpson

[57] ABSTRACT

Data transmission through data paths is synchronized using a symmetrical clock signal. In order to avoid dynamic hazards, which arise due to different delay times during data transmission in the data paths, an intermediate storage element is respectively arranged in each data path. It does not forward the received data signals into the subsequent circuit blocks until towards the end of the clock signal impulse used for the synchronization of the data transmission.

10 Claims, 3 Drawing Sheets

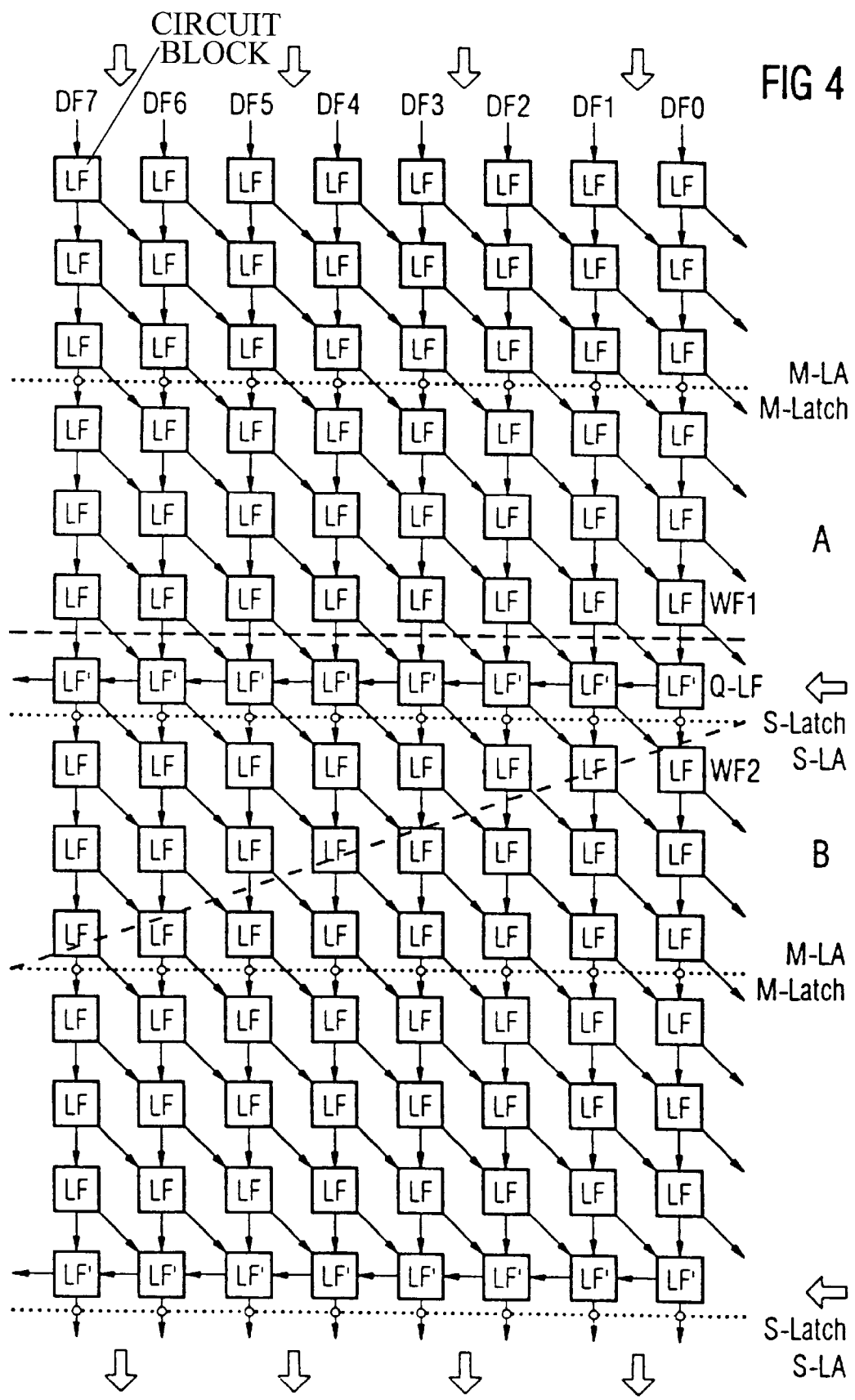

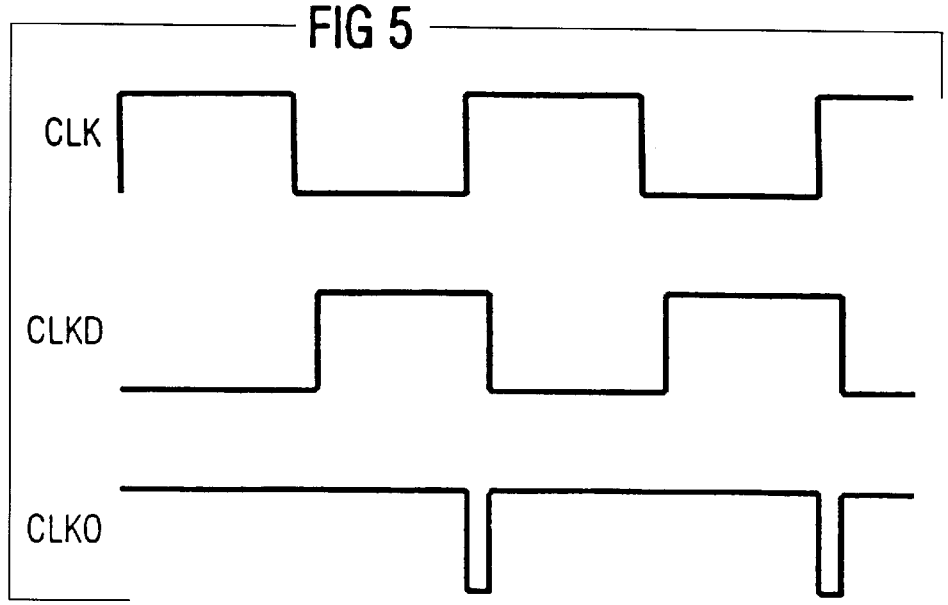
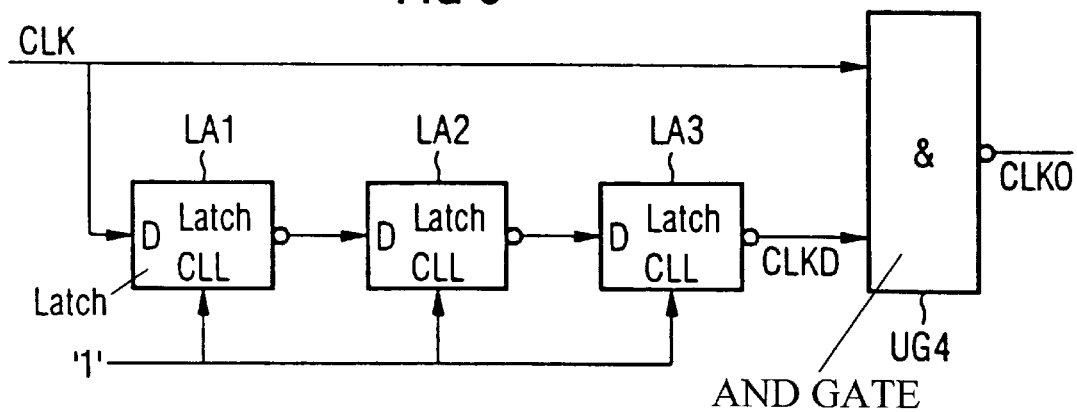

CMOS CIRCUIT COMPOSED OF CMOS CIRCUIT BLOCKS ARRANGED IN BIT-PARALLEL DATA PATHS

BACKGROUND OF THE INVENTION

In bit-parallel CMOS data path architectures, power losses occur due to dynamic hazards, which losses contribute significantly to the total power loss. The power loss of digital static CMOS circuits is essentially determined by the charges to be recharged of the transistor capacitances and of the transmission capacitances. The following holds approximately for the power loss $P_t$:

$$P_t \approx \alpha C_L V_{DD}^2 f_c$$

$C_L$ thereby designates the transistor capacitance and transmission capacitance to be recharged, $V_{DD}$ designates the supply voltage, $f_c$ designates the clock frequency and a designates the switching probability.

Static hazards are defined as logical errors in digital circuits that arise due to the different runtimes of the gates used. A simple example of this is shown in FIG. 1. A circuit of CMOS circuit blocks is shown here, consisting essentially of AND gates UG1, UG2, UG3 and bistable flip-flops FF1, FF2. The signals $Y_1$, $Y'_1$, $\overline{Y_1}$, $\overline{Y_1}'$, X inside the circuit block of FIG. 1 are shown in FIG. 2, insofar as they are variable. Assume that the signals $Y_1$ and $Y_1$ change simultaneously to logical "1" or to logical "0." The corresponding signals Y1' and Y' then appear at the output of the AND-gates UG1 and UG2. If it is assumed that the AND-gate UG2 switches with delay T and the AND-gate UG1 switches without delay, a temporary logical "1" appears as the signal X at the output of the AND-gate UG3, which "1" causes an undesired setting of the subsequent bistable flip-flop FF2. If the switching speeds of the two AND-gates UG1 and UG2 are equal, no hazard occurs. In the last line of FIG. 2, the hazard X is shown at the output of the AND-gate UG3, which occurs due to the delay T of the AND-gate UG2.

Switching processes in which, due to different runtimes, the output of a gate switches several times before reaching its final logical state are designated dynamic hazards.

Up to now, various methods have been used to reduce the switching processes in digital circuits (E. J. Mc Cluskey, Logic Design Principles, Prentice Hall, Englewood Cliffs, N.J. 07632, 1986, T. K. Liu, Synthesis Algorithm for 2-Levels MOS Networks, IEEE Trans. On Computers, Vol. C-24, No. 1, January 1975). One possibility is to minimize the number of logical gates required for a realization of a function. As a rule, the dynamic hazards are thereby also indirectly reduced. In addition, specific programs have been developed for the minimization of the switching frequency and thereby for the reduction of the power loss (J. M. Rabaey, Low Power Digital Design, Proc. ISCA '94, London, Lecture Notes, Chapter 8, May 1994, P. Landman und J. rabaey, Power Estimation for High level Synthesis, Proc. 1993 EDAC Conference, Paris, February 1993). One strategy for the minimization of the dynamic hazards is to try to make all signal paths the same length, if possible. This method is shown in FIG. 3. Circuits of three circuit blocks FA, FB, FC are shown here. While dynamic hazards can occur in the left circuit at the outputs 2 and 3, dynamic hazards no longer occur in the right circuit, provided that the signal runtimes of the blocks FA' and FB' are equal. Digital filters are described in W. Ulbrich und T. G. Noll, Design of Dedicated MOS Digital Filters for High-Speed Applications. Proc., ISCAS' 1985, Kyoto, pp. 255–258, June 1985.

SUMMARY OF THE INVENTION

It is an object of the present invention to reduce the switching processes in a CMOS circuit composed of CMOS circuit blocks arranged in bit-parallel data paths, in order to reduce the probability of the occurrence of hazards.

In general terms the present invention is a CMOS circuit composed of CMOS circuit blocks arranged in bit-parallel data paths. The transmission through the data paths is synchronized by a symmetrical clock signal. Intermediate storage elements, which are respectively controlled by an asymmetrical clock signal and which store the data in the data paths, are arranged in the data paths after an equal number of circuit blocks. A system is provided that produces, from the symmetrical clock signal, the asymmetrical clock signal for the intermediate storage elements for the forwarding of the data in the data paths.

Advantageous developments of the present invention are as follows.

For the synchronization of the data transmission in the data paths by the clock signal, master-slave elements are provided as intermediate storage elements. A master unit, switched by the symmetrical clock signal with impulses thereof that are of one polarity, is respectively arranged in each data path after an equal number of circuit blocks. A slave unit switched by the asymmetrical clock signal is respectively arranged behind the master units after an equal number of circuit blocks.

The system for producing the asymmetrical clock signal has a NAND-gate and several slave latches connected one after the other. The clock signal is directly supplied to the NAND-gate and is supplied in delayed form via the slave latches.

The latches used for delaying symmetrical the clock signal correspond in construction to the intermediate storage elements controlled by the asymmetrical clock signal.

Due to the fact that intermediate storage elements, for example latches, which intermediately store the transmitted data, are arranged in the data paths, and that these intermediate storage elements are controlled with an asymmetrical clock pulse, it is achieved that the data is transmitted from the intermediate storage elements into the data paths at a time at which the data received from preceding circuit blocks has already been securely stored. The consequence is that the data appear at the output of the intermediate storage elements at the same time, and thus hazards can no longer occur in the subsequent circuit blocks.

BRIEF DESCRIPTION OF THE DRAWINGS

The features of the present invention which are believed to be novel ,are set forth with particularity in the appended claims. The invention, together with further objects and advantages, may best be understood by reference to the following description taken in conjunction with the accompanying drawing, in which:

FIG. 4 shows a typical segment of a bit-parallel data path circuit with CMOS circuit blocks, according to the present invention;

FIG. 5 shows a clock impulse diagram that represents the clock signals for controlling the circuit blocks and intermediate storage elements in the CMOS circuit according to the present invention;

FIG. 6 shows a circuit arrangement for producing the asymmetrical clock signal for the intermediate storage elements according to the present invention.

DESCRIPTION OF THE PREFERRED EMBODIMENTS

Figure 1:
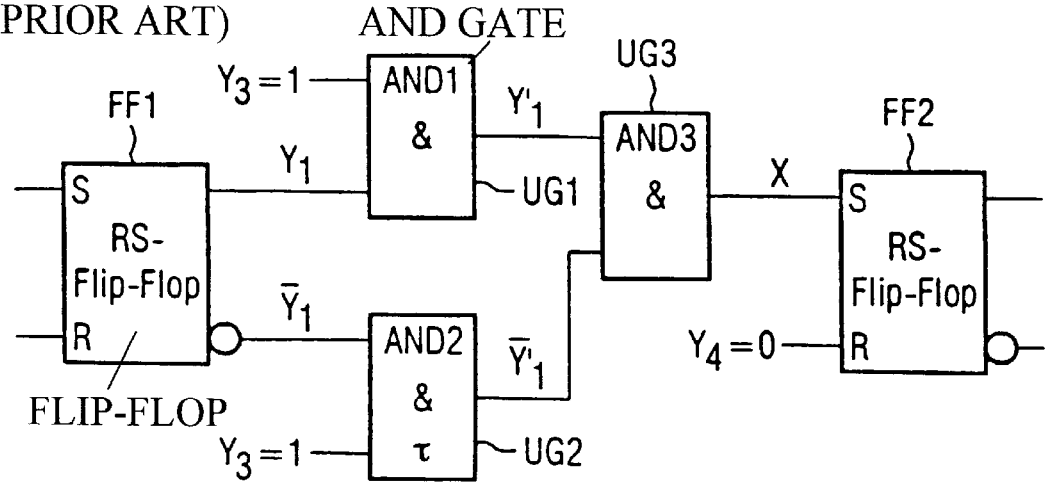
FIGS. 1–3 depict prior art circuits and signals.
Figure 2:
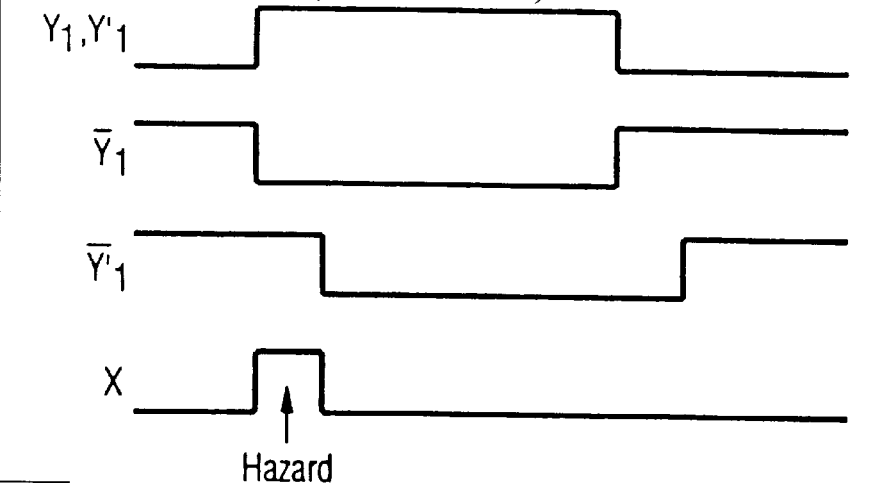
Figure 2:
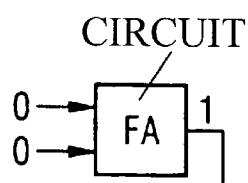
Figure 3:
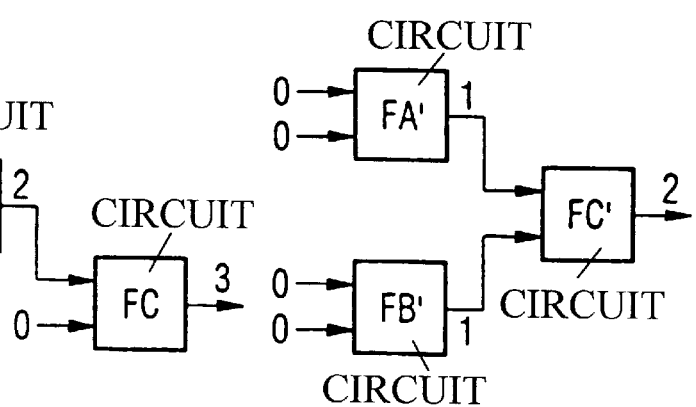

FIG. 4 shows a segment of a bit-parallel data path circuit. Circuit structures of this sort occur for example in parallel multipliers, bit-parallel transversal filters, recursive filters and in processors. Here circuit blocks LF are arranged in the data paths DFODF7. The data can run perpendicularly through the data paths DF, but the data can also be forwarded to adjacent data paths. In order to synchronize the course of the data through the data paths, intermediate storage elements, for example master-slave registers, can be arranged in the data paths, which are controlled by a clock signal CLK. In FIG. 4, after an equal number of circuit blocks LF there is a respective intermediate storage element, and first of all for example a master intermediate storage element M-LA, and there is in turn, after an equal number of additional circuit blocks, a slave intermediate storage element S-LA. For demonstration, circuit blocks LF' are arranged before the slave intermediate storage elements S-LA, which blocks permit a data transmission to respectively adjacent circuit blocks transverse to the course of the data paths. This series of circuit blocks LF' is designated Q-LF in FIG. 4.

The intermediate storage elements arranged in the data paths can be realized according to the master-slave principle. They are arranged in a distributed fashion in such an architecture that a synchronization of the data flow is achieved by means of the circuit. The maximum clock frequency is then given by the sum of the signal runtimes of the circuit blocks LF between a respective master and slave intermediate storage element of the circuit block following the slave intermediate storage element, as well as the runtime of a master intermediate storage element and of a slave intermediate storage element. The runtime is thereby independent of the position of the intermediate storage elements inside the circuit.

In normal operation of the intermediate storage elements with a symmetrical clock signal, designated for example with CLK in FIG. 5, the occurrence of dynamic hazards is strongly influenced by the position of the intermediate storage elements. This can be explained on the basis of FIG. 4. Here data is continuously applied in parallel at the upper edge (indicated by the arrow). Since the runtimes of the circuit blocks LF are equal, and their outputs lead only to the next cell row of circuit blocks, a parallel wavefront WF1 oriented downward results, which is then changed into an oblique wavefront in the series Q-LF above the slave intermediate storage element S-LA by the circuit blocks LF', since in this series the circuit blocks LF' also have horizontal outputs to their neighboring circuit blocks. In the higher-value bit positions, dynamic hazards occur as a result, because the arrival of the vertical and horizontal data signals is different. An oblique wavefront WF2 forms, which continues downward, also leads to dynamic hazards. Since the circuit blocks on the left edge have the largest differences upon arrival of the data signals, the danger of dynamic hazards is greatest in them.

In FIG. 4, the position of the wavefronts WF1, WF2 is indicated by the broken lines. The wavefront is horizontal above the intermediate storage element S-LA, and in contrast is oblique underneath the intermediate storage element S-LA.

In order to avoid dynamic hazards, the circuit must be influenced such that the original wavefront WF1 is produced again, and the occurrence of dynamic hazards is thereby prevented in the subsequent circuit blocks. An influencing of the wavefront can be achieved using the intermediate storage elements (in FIG. 4, the intermediate storage elements S-LA), by controlling them with a clock signal such that they have a minimally long transparent phase, whose minimum duration is determined by the characteristics of the intermediate storage element. A minimum transparent phase of this sort for the intermediate storage elements is achieved using an asymmetrical clock signal, which is shown in FIG. 5 and is there designated CLK0. By means of such an asymmetrical clock signal CLK0 at the intermediate storage element S-LK, it is ensured that the data signals are first forwarded to the circuit blocks LF connected after the intermediate storage elements S-LA, if the intermediate storage element has received its data signal at the highest-valued position of the series Q-LF.

FIG. 6 shows a circuit arrangement for producing the asymmetrical clock signal for the intermediate storage elements. The circuit arrangement according to FIG. 6 consists of a delay element realized for example from three inverting slave latches (which are for example identical with the latches used in the data path) and a NAND gate UG4.

The latches are designated LA1 to LA3. The circuit arrangement produces an asymmetrical clock signal CLK0 from the symmetrical clock signal CLK, with a pulse width of the low phase that is defined by the delay element. The delayed clock signal is called CLKD in FIG. 5 and FIG. 6.

If the intermediate storage elements S-LA are controlled with the clock signal CLK0, these elements then do not forward their data signals to the circuit blocks connected downstream until it is ensured that the highest-valued intermediate storage element has also obtained its data signal from the preceding circuit block. A horizontal wavefront corresponding to WF1 thereby again results from the oblique wavefront WF2 indicated in FIG. 4. In this way, dynamic hazards are securely avoided.

The intermediate storage elements arranged in the circuit can be realized as a master-slave register, but can also be master-slave latches. If the master-slave principle is used, the master intermediate storage elements can be controlled using a symmetrical clock signal, while in contrast the slave intermediate storage elements can be controlled using the asymmetrical clock signal obtained from the symmetrical clock signal.

The invention is not limited to the particular details of the method and apparatus depicted and other modifications and applications are contemplated. Certain other changes may be made in the above described apparatus without departing from the true spirit and scope of the invention herein involved. It is intended, therefore, that the subject matter in the above depiction shall be inter-pretend as illustrative and not in a limiting sense.

What is claimed is:

1. A CMOS circuit having CMOS circuit blocks arranged in bit-parallel data paths, comprising:
    a symmetrical clock signal for synchronizing transmission through data paths;
    intermediate storage elements, which are respectively controlled by an asymmetrical clock signal and which store data in the data paths, the intermediate storage elements being arranged in the data paths after an equal number of circuit blocks in the data paths;
    system for producing from the symmetrical clock signal, the asymmetrical clock signal for the intermediate storage elements for forwarding of the data in the data paths.

2. The CMOS circuits according to claim 1, wherein:
    for synchronization of the data transmission in the data paths using the clock signal, master-slave elements are provided as intermediate storage elements;
    in each data path a master unit, switched by the symmetrical clock signal with impulses thereof that are of one polarity, is arranged after an equal number of circuit blocks;

in each data path a slave unit switched by the asymmetrical clock signal is arranged behind the master unit after an equal number of circuit blocks.

3. The CMOS circuit according to claim 1, wherein:

the system for producing the asymmetrical clock signal comprise a NAND-gate and a plurality of slave latches connected in series;

the symmetrical clock signal is supplied directly to the NAND-gate and is supplied in delayed form via the slave latches.

4. The CMOS circuit according to claim 3, wherein the latches used for delaying the clock symmetrical signal correspond in structure to the intermediate storage elements controlled by the asymmetrical clock signal.

5. A CMOS circuit having CMOS circuit blocks arranged in bit-parallel data paths, comprising:

a symmetrical clock signal for synchronizing transmission through data paths;

intermediate storage elements, which are respectively controlled by an asymmetrical clock signal and which store data in the data paths, the intermediate storage elements being arranged in the data paths after an equal number of circuit blocks in the data paths;

system for producing from the symmetrical clock signal, the asymmetrical clock signal for the intermediate storage elements for forwarding of the data in the data paths;

the intermediate storage elements being master-slave elements for synchronization of the data transmission in the data paths using the clock signal;

in each data path a master unit, switched by the symmetrical clock signal with impulses thereof that are of one polarity, being arranged after an equal number of circuit blocks; and in each data path a slave unit switched by the asymmetrical clock signal being arranged behind the master unit after an equal number of circuit blocks.

6. The CMOS circuit according to claim 5, wherein:

the system for producing the asymmetrical clock signal comprise a NAND-gate and a plurality of slave latches connected in series;

the symmetrical clock signal is supplied directly to the NAND-gate and is supplied in delayed form via the slave latches.

7. The CMOS circuit according to claim 6, wherein the latches used for delaying the clock symmetrical signal correspond in structure to the intermediate storage elements controlled by the asymmetrical clock signal.

8. A CMOS circuit having CMOS circuit blocks arranged in bit-parallel data paths, comprising:

a symmetrical clock signal for synchronizing transmission through data paths;

intermediate storage elements, which are respectively controlled by an asymmetrical clock signal and which store data in the data paths, the intermediate storage elements being arranged in the data paths after an equal number of circuit blocks in the data paths;

system for producing from the symmetrical clock signal, the asymmetrical clock signal for the intermediate storage elements for forwarding of the data in the data paths; the system for producing the asymmetrical clock signal having a NAND-gate and a plurality of slave latches connected in series; and the symmetrical clock signal being supplied directly to the NAND-gate and supplied in delayed form via the slave latches.

9. The CMOS circuits according to claim 8, wherein:

for synchronization of the data transmission in the data paths using the clock signal, master-slave elements are provided as intermediate storage elements;

in each data path a master unit, switched by the symmetrical clock signal with impulses thereof that are of one polarity, is arranged after an equal number of circuit blocks;

in each data path a slave unit switched by the asymmetrical clock signal is arranged behind the master unit after an equal number of circuit blocks.

10. The CMOS circuit according to claim 8, wherein the latches used for delaying the clock symmetrical signal correspond in structure to the intermediate storage elements controlled by the asymmetrical clock signal.

* * * * *